(12) United States Patent
Kizaki et al.

(10) Patent No.: US 7,804,156 B2
(45) Date of Patent: Sep. 28, 2010

(54) SEMICONDUCTOR WAFER ASSEMBLY AND METHOD OF PROCESSING SEMICONDUCTOR WAFER

(75) Inventors: Kiyotaka Kizaki, Ota-Ku (JP); Satoshi Yamanaka, Ota-ku (JP)

(73) Assignee: Disco Corporation, Tokyo (JP)

( * ) Notice: Subject to any disclaimer, the term of this patent is extended or adjusted under 35 U.S.C. 154(b) by 292 days.

(21) Appl. No.: 12/119,204

(22) Filed: May 12, 2008

(65) Prior Publication Data

US 2008/0296733 A1   Dec. 4, 2008

(30) Foreign Application Priority Data

May 30, 2007   (JP) .............................. 2007-143466

(51) Int. Cl.
*H01L 29/06*   (2006.01)
*H01L 21/30*   (2006.01)

(52) U.S. Cl. ....................... 257/618; 257/623; 257/783; 257/E21.211; 257/E29.001; 438/118; 438/458; 438/459; 438/460

(58) Field of Classification Search ................. 257/618, 257/E21.211, E29.001, 623, 783; 438/458, 438/459, 118, 460

See application file for complete search history.

(56) References Cited

U.S. PATENT DOCUMENTS 5,751,055 A * 5/1998 Maruyama et al. .......... 257/618
2007/0093040 A1 * 4/2007 Sekiya ....................... 438/460

FOREIGN PATENT DOCUMENTS

| JP | A 5-63077 | 3/1993 |
| JP | A 2005-276971 | 10/2005 |

OTHER PUBLICATIONS

Ghahghahi et al., Preparation of Custom Gate Array Silicon Wafers to Handle Specific Wafer Size in Metallization Process, IEEE/CHMT IEMT Symposium, Jan. 1989.*

* cited by examiner

*Primary Examiner*—Eugene Lee
*Assistant Examiner*—Peniel M Gumedzoe
(74) *Attorney, Agent, or Firm*—Greer, Burns & Crain, Ltd.

(57) ABSTRACT

A semiconductor wafer assembly includes a disk-shaped semiconductor wafer including on a face side thereof a flat area having a plurality of semiconductor devices formed thereon and a beveled surface disposed around the flat surface, and a circular adhesive film bonded to a reverse side of the semiconductor wafer. The adhesive film is bonded only to an area of the reverse side which is coextensive with the flat area.

2 Claims, 6 Drawing Sheets

SEMICONDUCTOR WAFER ASSEMBLY AND METHOD OF PROCESSING SEMICONDUCTOR WAFER

BACKGROUND OF THE INVENTION

1. Field of the Invention

The present invention relates to a semiconductor wafer having a plurality of devices formed on a face side thereof and an adhesive film applied to the reverse side thereof, and a method of processing a semiconductor wafer, including the steps of grinding the reverse side of the semiconductor wafer to thin the semiconductor wafer and thereafter applying an adhesive film to the reverse side of the semiconductor wafer.

2. Description of the Related Art

According to the recent semiconductor device technology, stacked packages having a plurality of stacked semiconductor chips, such as MCPs (multi-chip packages) and SiPs (system-in packages) have effectively been utilized for higher packaging density and smaller size. The semiconductor chips of the stacked packages include die-bonding adhesive films called DAF (Die Attach Film) applied to the reverse sides thereof for holding the semiconductor chips stacked. Each of the adhesive films is made of a sticky resin material such as epoxy and polyimide, and is applied to the reverse side of the semiconductor wafer after the reverse side of the wafer is ground to thin the wafer.

It has been the general practice to grind the reverse side of a semiconductor wafer by holding the face side of the semiconductor wafer closely against a chuck table so that the reverse side thereof to be ground is exposed, and pressing a grinding wheel which is rotating at a high speed against the reverse side of the semiconductor wafer. A protective tape is applied to the face side of the semiconductor wafer to prevent the devices formed thereon from directly contacting the chuck table. The wafer is then diced into a plurality of individual chips. To dice the wafer, a dicing tape supported by a dicing frame is applied to the adhesive film on the reverse side, and the semiconductor wafer, the dicing frame, and the dicing tape are set on a wafer dicing device (see Japanese Patent Laid-Open No. 2005-276971). The wafer dicing device may be a dicing device for pressing a rotary blade into the semiconductor wafer to dice the semiconductor wafer or a laser device for applying a laser beam to the wafer to dice the semiconductor wafer. When the wafer dicing device is to dice the semiconductor wafer, the protective tape is peeled off the face side of the semiconductor wafer (see Japanese Patent Laid-Open No. Hei 5-63077).

Normally, the semiconductor wafer has its peripheral edge beveled to an arcuate surface extending from the face side to the reverse side for preventing the peripheral edge from being chipped when it undergoes shocks. When the reverse side of the semiconductor wafer is grounded to a thickness which is at least one-half its original thickness, the diameter of the semiconductor wafer becomes smaller than the original diameter. Therefore, the diameter of the protective tape applied to the face side of the semiconductor wafer becomes larger than the diameter of the semiconductor wafer, causing the protective tape to bring its peripheral edge close to the reverse side of the semiconductor wafer.

When the adhesive film is then applied to the reverse side of the semiconductor wafer, the portion of the peripheral edge of the adhesive film which projects outwardly from the peripheral edge of the semiconductor wafer tends to contact the peripheral edge of the protective tape. If the peripheral edge of the adhesive film contacts the peripheral edge of the protective tape, then the protective tape sticks to the adhesive film and cannot easily be peeled off therefrom. In the subsequent wafer dicing step, consequently, it is difficult to peel off the protective film from the semiconductor wafer. The trouble manifests itself particularly if the semiconductor wafer is very thin or the adhesive film is relatively thick and is heated when it is applied. Some dicing tapes have an adhesive tape integrally formed with one surface thereof. When such an adhesive tape is applied to the ground reverse side of a semiconductor wafer, the adhesive tape also tends to be brought into contact with the protective tape which then cannot easily be peeled off from the adhesive tape.

SUMMARY OF THE INVENTION

It is an object of the present invention to provide a semiconductor wafer assembly which is capable of reliably preventing an adhesive film applied to the ground reverse side of a semiconductor wafer from contacting a protective tape applied to the face side of the semiconductor wafer, so that the protective tape remains not to stick to the adhesive film, and allowing the protective tape to be smoothly peeled off from the face side of the semiconductor wafer, and a method of processing a semiconductor wafer.

In accordance with an aspect of the present invention, there is provided a semiconductor wafer assembly including a disk-shaped semiconductor wafer including on a face side thereof a flat area having a plurality of semiconductor devices formed thereon and a beveled surface disposed around the flat surface, and a circular adhesive film bonded to a reverse side of the semiconductor wafer, wherein the adhesive film is bonded only to an area of the reverse side which is coextensive with the flat area.

With the semiconductor wafer assembly, since the adhesive film is bonded only to the area of the reverse side which is coextensive with the flat area, a space or clearance is defined between the peripheral edge of the adhesive film and the peripheral edge of the protective tape bonded to the face side of the semiconductor wafer. Therefore, the protective tape is prevented from sticking to the adhesive film, which can thus reliably be peeled off from the face side of the semiconductor wafer.

The beveled surface, which is of an annular shape and disposed on the peripheral edge of the semiconductor wafer, has a width of about 0.5 mm. The object of the present invention is achieved if the peripheral edge of the adhesive film is present radially inwardly of the beveled surface. Practically, the adhesive film should be at least 1 mm smaller in diameter than the semiconductor wafer, with a clearance, which is at least 0.5 mm wide, being defined a peripheral edge of the adhesive film and a peripheral edge of the wafer.

In accordance with another aspect of the present invention, there is provided a method of processing a disk-shaped semiconductor wafer including on a face side thereof a flat area having a plurality of semiconductor devices formed thereon and a beveled surface disposed around the flat surface, including the steps of bonding a protective tape to the face side of the semiconductor wafer with the semiconductor devices formed thereon, grinding a reverse side of the semiconductor wafer to thin the semiconductor wafer, bonding an adhesive film to the reverse side of the semiconductor wafer only in an area thereof which is coextensive with the flat area on the face side of the semiconductor wafer, and holding the reverse side of the semiconductor wafer to which the adhesive film is bonded and peeling off the protective film from the face side of the semiconductor wafer.

With the above processing method, when the adhesive tape has been bonded, the semiconductor wafer assembly according to the present invention is obtained. The adhesive film bonded to the reverse side of the semiconductor wafer is present only in the area thereof which is coextensive with the flat area on the face side of the semiconductor wafer. Therefore, the protective tape is prevented from sticking to the adhesive film, which can thus reliably be peeled off from the face side of the semiconductor wafer. Consequently, the protective film can subsequently be peeled off smoothly and reliably from the face side of the semiconductor wafer.

According to the present invention, the adhesive film bonded to the reverse side of the semiconductor wafer, which has been ground, is reliably prevented from contacting the protective tape bonded to the face side of the semiconductor wafer. Therefore, the protective tape remains not to stick to the adhesive film, and hence can smoothly be peeled off from the face side of the semiconductor wafer.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENT

An embodiment of the present invention will be described in detail below with reference to the drawings.

Figure 1:
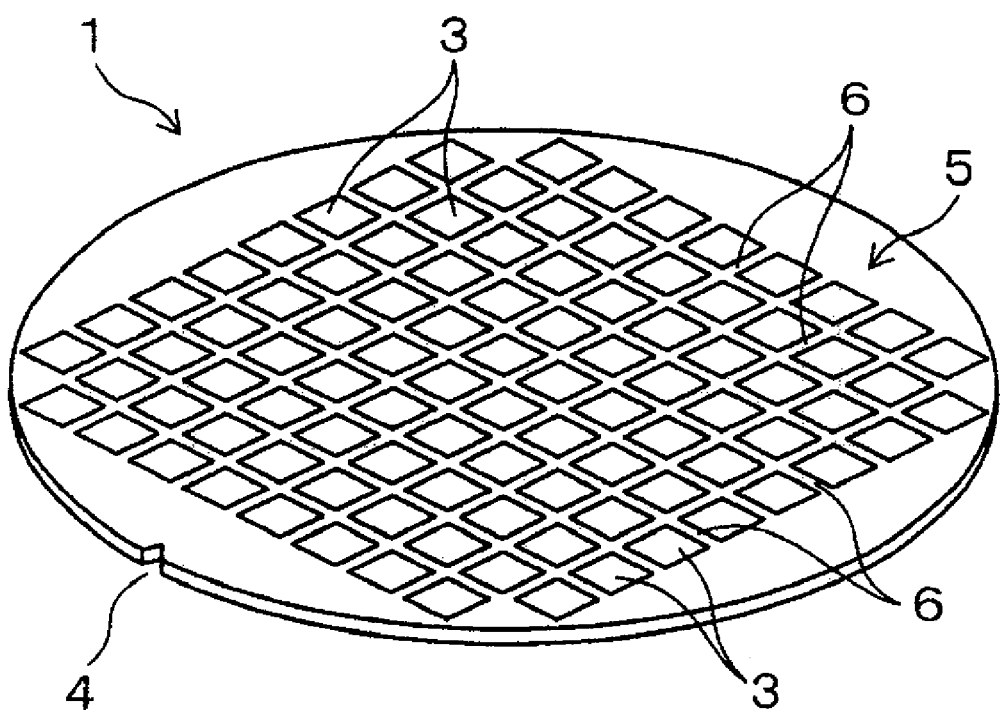
FIG. 1 is a perspective view of a semiconductor wafer according to an embodiment of the present invention.

FIG. 1 shows a disk-shaped semiconductor wafer (hereinafter referred to simply as "wafer") 1 whose reverse side has been ground to thin the wafer 1 from its blank thickness to a desired thickness. The unground blank of the wafer 1 has its peripheral edge beveled to an arcuate surface extending from the face side to the reverse side thereof. When the reverse side of the wafer 1 is ground to thin the wafer 1, as shown in FIG. 3, its peripheral edge has a beveled surface 2 shaped like a knife edge having only a face side thereof arcuate in cross-sectional shape.

As shown in FIG. 1, the wafer 1 has on its face side a plurality of rectangular semiconductor chips (devices) 3 separated from each other by a grid of dicing lines 6. Each of the semiconductor chips 3 has electronic circuits, not shown, such as ICs and LSI circuits, formed thereon. The wafer 1 also includes a V-shaped notch 4 defined at a given position in the peripheral edge thereof for indicating the crystalline orientation of the semiconductor. The semiconductor chips 3 are disposed in a flat area 5 which is a circular flat area on the face side of the wafer 1. The beveled surface 2 extends annularly along the peripheral edge of the flat area 5.

Figure 3:
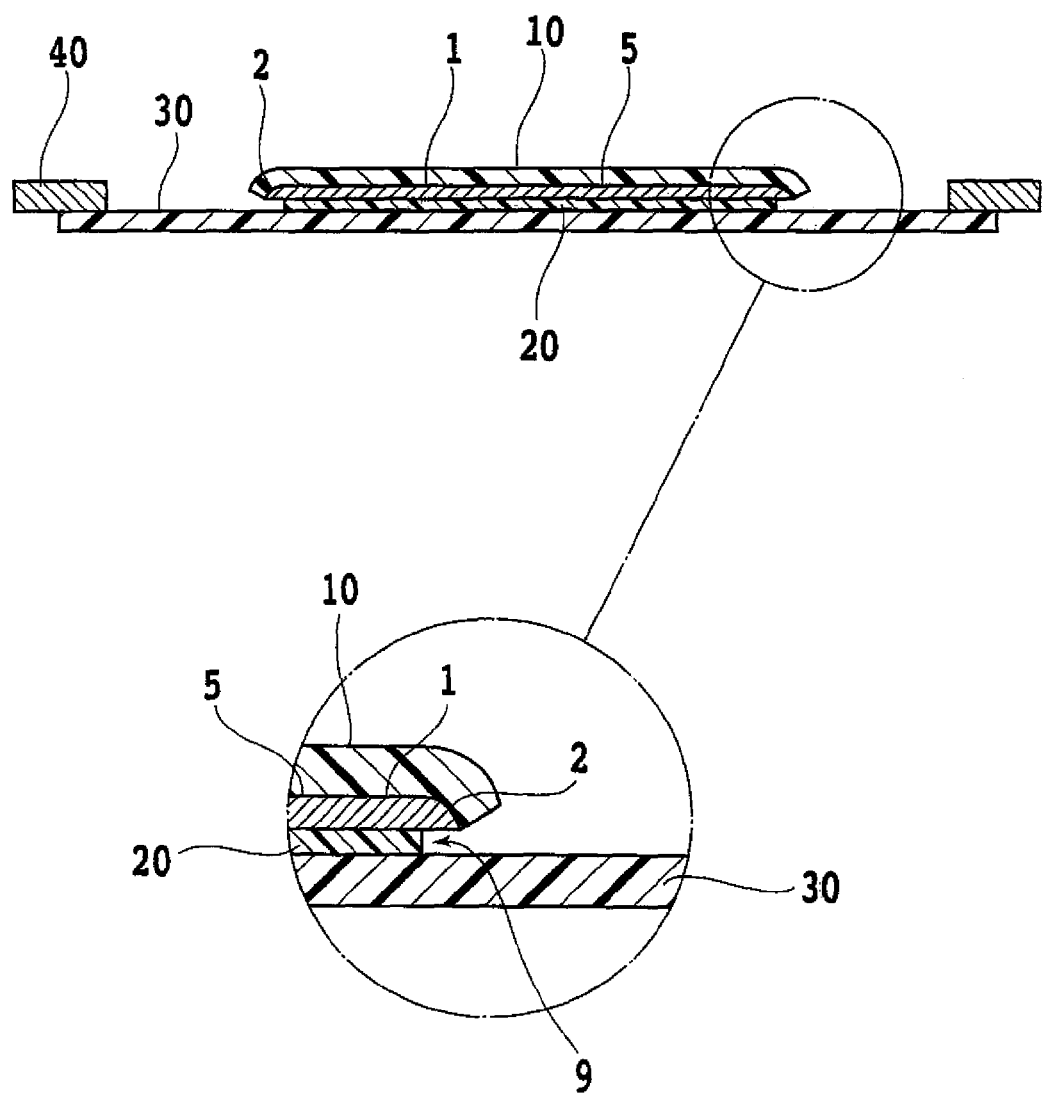
FIG. 3 is a cross-sectional view taken along line III-III of FIG. 2.

As shown in FIG. 3, a protective tape 10 (omitted from illustration in FIG. 1) is applied or bonded to the entire face side of the wafer 1. The protective tape 10 includes a sheet of polyethylene or polyolefin having a thickness ranging from 100 µm to 200 µm, for example, and coated on one surface thereof with an adhesive compound to a thickness of about 10 µm. The protective tape 10 is of a circular shape having a diameter that is basically the same as the diameter of the wafer 1. Before the reverse side of the wafer 1 is ground, the protective tape 10 is applied concentrically to the face side of the wafer 1.

The reverse side of the wafer 1 is ground by holding the face side of the wafer 1 closely against a chuck table so that the reverse side thereof to be ground is exposed, and pressing a grinding wheel which is rotating at a high speed against the reverse side of the wafer 1. If the face side of the wafer 1 is directly brought into contact with the chuck table, the semiconductor chips 3 may possibly be damaged by the chuck table. Therefore, the protective tape 10 is applied to the face side of the wafer 1 to protect the face side of the wafer 1.

After the reverse side of the wafer 1 is ground to thin the wafer 1 to a predetermined thickness, a bonding adhesive film 20 (see FIG. 3) is applied or bonded to the ground reverse side of the wafer 1. Thereafter, the wafer 1 is diced along the dicing lines 6 into a plurality of individual chips 3. At the same time that the adhesive film 20 is applied to the reverse side of the wafer 1, a dicing tape 30 which serves as a handling jig to be used for dicing the wafer 1 is applied also to the reverse side of the wafer 1.

Figure 2:
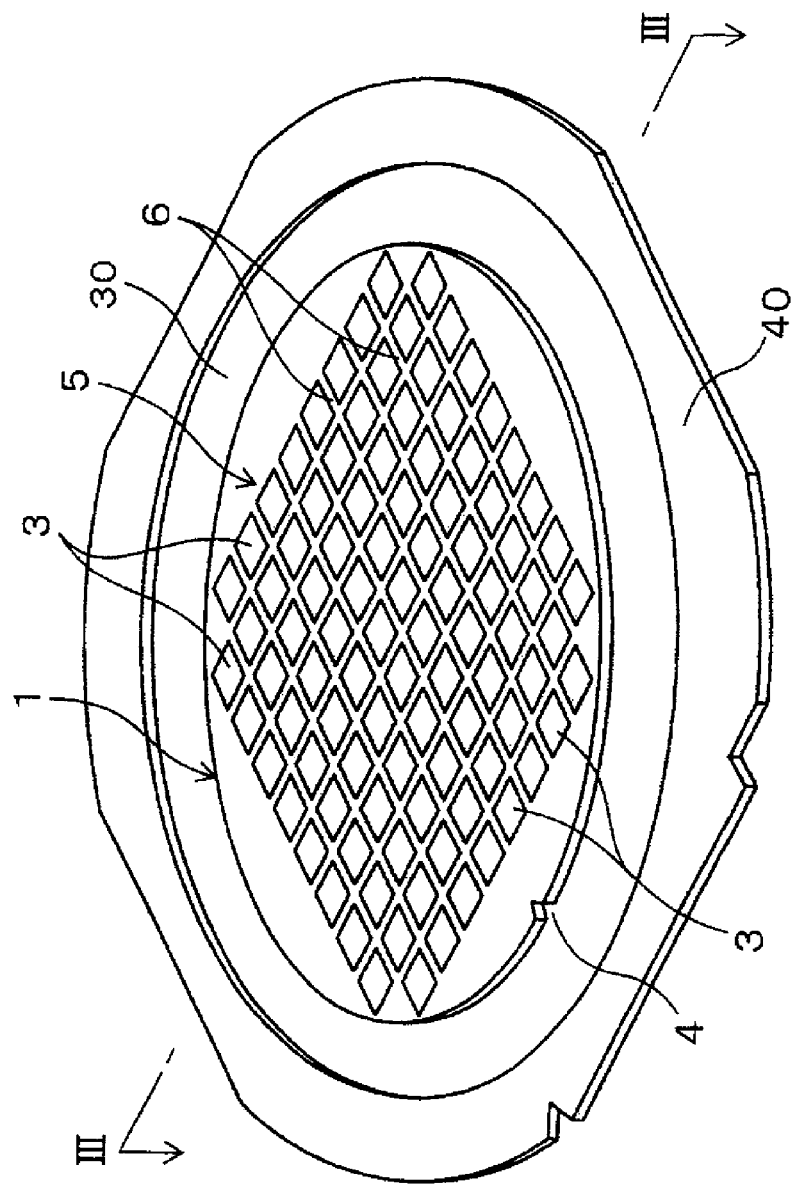
FIG. 2 is a perspective view of the semiconductor wafer according to the embodiment of the present invention with a dicing tape applied to the reverse side of the semiconductor wafer with an adhesive tape interposed therebetween.

FIGS. 2 and 3 show the manner in which the dicing tape 30 integrally combined with the adhesive film 20 is applied to the reverse side of the wafer 1 with the adhesive film 20 interposed therebetween. The dicing tape 30 is an adhesive tape including a base of polyvinyl chloride having a thickness of about 100 µm, for example, and coated on one surface with an adhesive compound of acrylic resin to a thickness of about 5 µm. An annular dicing frame 40 having an inside diameter which is greater than the diameter of the wafer 1 is attached to an outer circumferential edge portion of the sticky surface (upper surface in FIG. 3) of the dicing tape 30. The dicing frame 40 is made of rigid sheet metal. The wafer 1 is handled through the dicing frame 40 and the dicing tape 30.

The adhesive film 20, which is of a circular shape, is disposed on the sticky surface of the dicing tape 30. The adhesive film 20 includes a resin film made of a thermosetting or thermoplastic resin such as epoxy and polyimide and having a thickness adjusted to a range from about 5 µm to 100 µm. The adhesive film 20 is integrally applied as a stacked layer to the sticky surface of the dicing tape 30 according to a coating process or a sheet applying process. The circular adhesive film 20 is applied concentrically to the reverse side of the wafer 1 only in an area thereof which is coextensive with the flat area 5 on the face side of the wafer 1. The beveled surface 2 of the wafer 1 has a radial width of about 0.5 mm. To apply the adhesive film 20 only to the area which is coextensive with the flat area 5, the diameter of the adhesive film 20 is required to be at least 1 mm smaller than the diameter of the wafer 1 and the adhesive film 20 is required to be applied concentrically to the wafer 1. When the adhesive film 20 is applied concentrically to the wafer 1, there is defined a clearance 9 (see an enlarged illustration on the right of FIG. 3), which is 0.5 mm or more wide, between the peripheral edge of the adhesive film 20 and the peripheral edge of the wafer 1.

According to the present embodiment, the adhesive film 20 integrally combined with the dicing tape 30 is applied to the wafer 1 as follows: Circular adhesive films 20 are applied at suitable longitudinal intervals to the sticky surface of the dicing tape 30 that is of an elongate shape wound as a roll. The dicing tape 30 is pulled beneath the reverse side of the wafer 1. One of the adhesive films 20 on the dicing tape 30 is positioned in alignment with the reverse side of the wafer 1, and is then applied thereto by a roller that is pressed against the dicing tape 30. At this time, the wafer 1 is placed centrally in the opening of the dicing frame 40, and the dicing tape 30 is applied to the dicing frame 40 and the wafer 1. Thereafter, the dicing tape 30 is cut off in alignment with the dicing frame 40.

The wafer 1 has been processed so far as follows: The protective tape 10 is applied to the face side of the wafer 1 on which the semiconductor chips 3 are formed (protective tape applying step). Then, the reverse side of the wafer 1 is ground to thin the wafer 1 to a predetermined thickness (thinning step). Thereafter, the adhesive film 20 is applied to the reverse side of the wafer 1 only in an area thereof which is coextensive with the flat area 5 on the face side of the wafer 1, and at the same time the dicing tape 30 is applied to the wafer 1 (adhesive film and dicing tape applying step). After the adhesive film and dicing tape applying step, the protective tape 10 is peeled off from the face side of the wafer 1 (protective film peeling step).

Figure 4A:
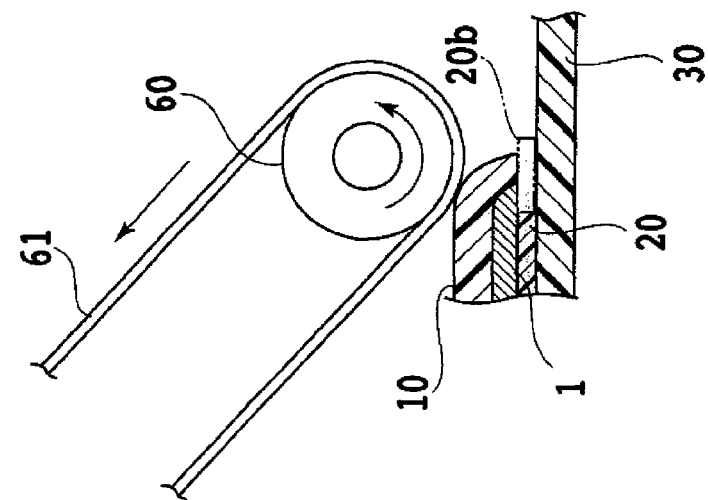
FIGS. 4A through 4C are side elevational views illustrative of a protective tape peeling step.
Figure 4B:
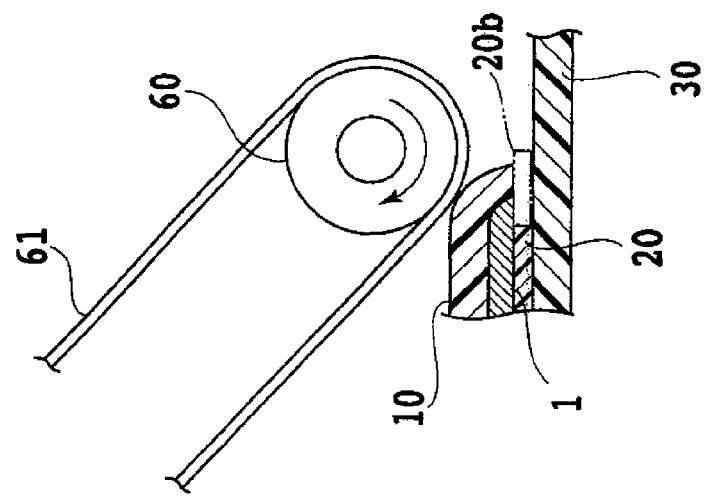
Figure 4C:
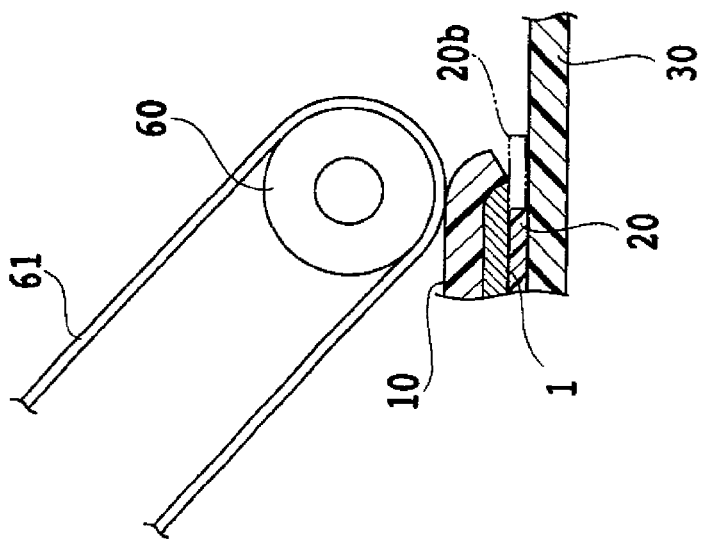

The protective tape 10 is smoothly peeled off by holding the dicing frame 40 horizontally with a support member with the wafer 1 facing upwardly, and then applying a peeling roller 60 shown in FIGS. 4A through 4C. Specifically, the peeling roller 60 is paired with another roller, not shown, and a strongly adhesive tape 61 with an adhesive layer on its face side is trained around the peeling roller 60 and the other roller. For peeling off the protective tape 10, as shown in FIG. 4A, the portion of the strongly adhesive tape 61 which is trained around the peeling roller 60 is held against the face side of the protective tape 10 at one end thereof, and then pressed under a load. Then, as shown in FIG. 4B, the peeling roller 60 is slightly displaced radially outwardly to the right as shown, so that the peripheral edge of the protective tape 10 has a radially outward portion sticking to the strongly adhesive tape 61. Then, as shown in FIG. 4C, the peeling roller 60 is rotated about its own axis in the direction indicated by the arrow, causing the strongly adhesive tape 61 to peel off the protective tape 10 from the face side of the wafer 1 and to carry the protective tape 10 thus peeled off.

The wafer 1 from which the protective tape 10 is peeled off, together with the dicing frame 40 and the dicing tape 30, is set on a wafer dicing device, not shown, and diced along all the dicing lines 6, producing a plurality of individual semiconductor chips 3 each backed with the corresponding piece of adhesive film 20. The semiconductor chips 3 are then picked up from the dicing tape 30. The wafer dicing device may be a dicing device for pressing a rotary blade into the wafer 1 to dice the wafer 1 or a laser device for applying a laser beam to the wafer 1 to dice the wafer 1.

According to the present embodiment, the adhesive film 20 applied to the reverse side of the wafer 1 which has been ground is of a size which is essentially the same as the flat area 5 on the face side of the wafer 1 and is applied to an area of the reverse side of the wafer 1 which is coextensive with the flat area 5. Therefore, the clearance 9 is maintained between the peripheral edge of the adhesive film 20 and the peripheral edge of the protective tape 10 which is applied to the face side of the wafer 1. Accordingly, the peripheral edge of the adhesive film 20 is prevented from contacting and sticking to the peripheral edge of the protective tape 10. As a result, the protective tape 10 can reliably be peeled off from the face side of the wafer 1 in the protective film peeling process.

An apparatus may be employed to automatically and continuously perform the process of pulling the dicing tape 30 with the adhesive films 20 applied thereto from its roll, positioning one of the adhesive films 20 beneath the reverse side of the wafer 1, and applying the adhesive film 20 to the reverse side of the wafer 1. Even if an error of ±0.3 mm is caused in positioning the adhesive film 20 with respect to the reverse side of the wafer 1 while the apparatus is in operation, since the clearance 9, which is 0.5 mm or more wide, is defined between the peripheral edge of the adhesive film 20 and the peripheral edge of the wafer 1, the adhesive film 20 does not project beyond the peripheral edge of the wafer 1. Therefore, the adhesive film 20 is prevented from contacting and sticking to the protective tape 10. If the clearance 9 between the peripheral edge of the adhesive film 20 and the peripheral edge of the wafer 1 is set to a width in the range from 0.5 mm to 1 mm, then the wafer 1 is less likely to have its peripheral edge broken into scattering fragments when the wafer 1 is diced by the wafer dicing device.

Figure 5:
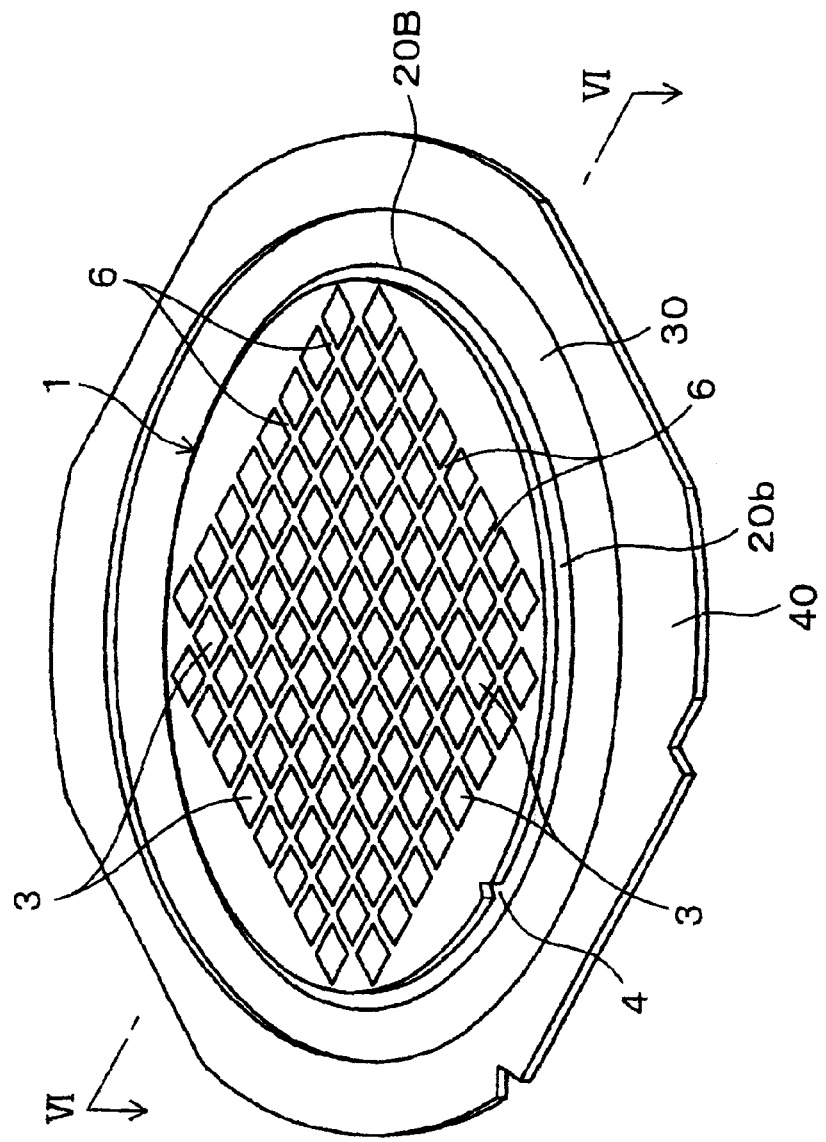
FIG. 5 is a perspective view of a semiconductor wafer according to the related art with a dicing tape applied to the reverse side of the semiconductor wafer with an adhesive tape interposed therebetween.
Figure 6:
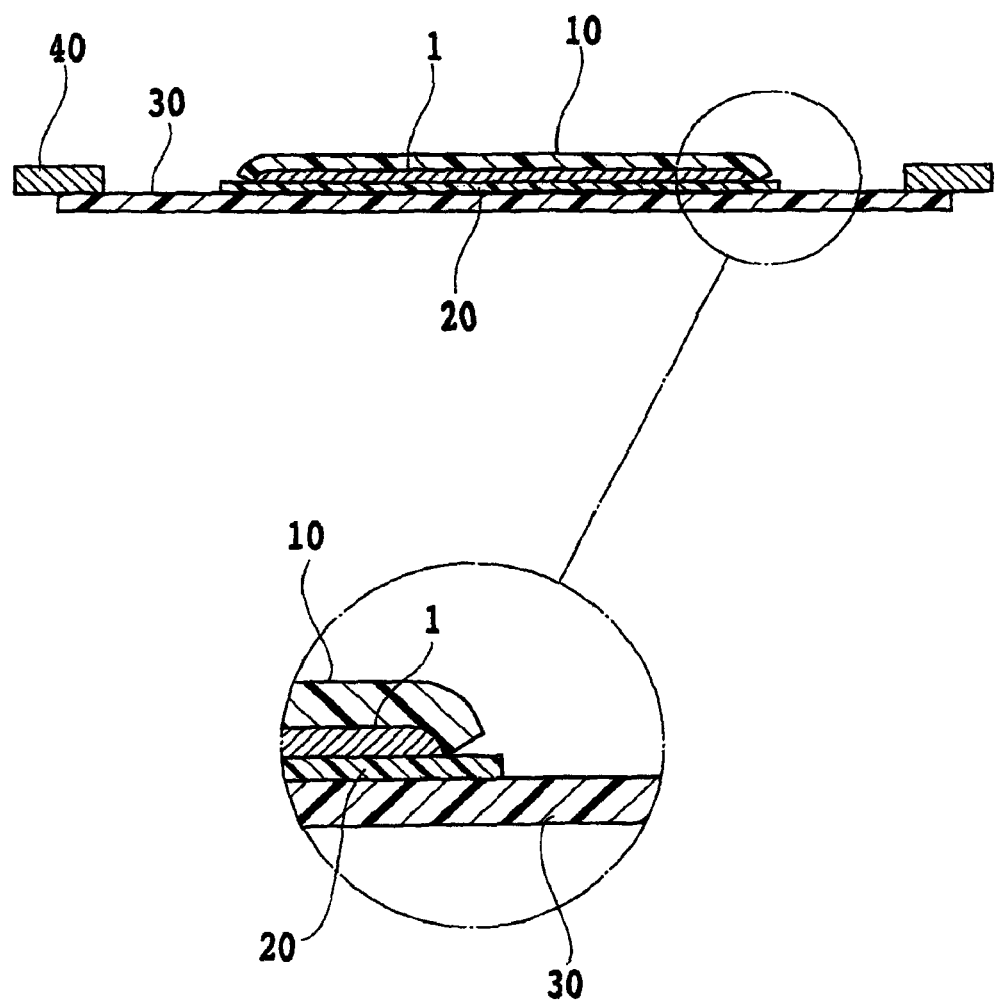
FIG. 6 is a cross-sectional view taken along line VI-VI of FIG. 5.

FIGS. 5 and 6 show a semiconductor wafer 1 of the related art with an adhesive film 20B applied to the reverse side of the wafer 1, the adhesive film 20B having a size greater than the area of the reverse side of the wafer 1 which is coextensive with the flat area 5 on the face side thereof and having a peripheral edge projecting beyond the peripheral edge of the wafer 1. The adhesive tape 20B is integrally stacked on the dicing tape 30, and has a diameter which is greater than the diameter of the wafer 1 at the time the adhesive tape 20B is stacked on the dicing tape 30. The portion of the peripheral edge of the adhesive tape 20B which projects beyond the peripheral edge of the wafer 1 tends to contact and stick to the protective tape 10. In the peeling process shown in FIGS. 4A through 4C, therefore, the protective tape 10 cannot smoothly be peeled off from the face side of the wafer 1.

FIGS. 4A through 4C show a projecting portion 20b, indicated by the broken lines, of the peripheral edge of the adhesive tape 20B, according to the related art. The projecting portion 20b of the peripheral edge of the adhesive tape 20B tends to contact and stick to the protective tape 10. According to the present embodiment, the adhesive tape 20 is free of the projecting portion 20b, and the clearance 9 is maintained between the peripheral edge of the adhesive film 20 and the peripheral edge of the wafer 1. Consequently, the adhesive tape 20 does not stick to the protective tape 10 which can smoothly and reliably be peeled off from the face side of the wafer 1.

In the above embodiment, the adhesive film 20 integrally combined with the dicing tape 30 is applied to the reverse side of the wafer 1. However, an adhesive film alone may be applied to the reverse side of the wafer 1. Such an adhesive film may be supplied from an elongate adhesive film wound as a roll, or circular adhesive films may be applied at suitable longitudinal intervals to one surface of an elongate separator sheet wound as a roll.

If an adhesive film is supplied from the elongate adhesive film wound as the roll, then the end of the elongate adhesive film pulled from the roll is applied to the reverse side of the wafer 1 and pressed thereagainst by a roller or the like. Then, the adhesive film is cut into a circular shape along the peripheral edge of the wafer 1. The adhesive film is cut into the circular shape along the peripheral edge of the flat area 5, so that the adhesive film is applied to the reverse side of the wafer 1 only in the area which is coextensive with the flat area 5.

If the circular adhesive films are applied to the separator sheet, the sheet wound as the roll is pulled from the roll, then one of the circular adhesive films is positioned in alignment with the reverse side of the wafer 1, pressed thereagainst by a roller or the like, and then peeled off from the separator sheet. Each of the circular adhesive films are applied to the separator sheet has a diameter which is essentially the same as the diameter of the flat area 5 of the wafer 1. If the diameter of the adhesive film is about 1 mm smaller than the diameter of the wafer 1, then when the adhesive film is automatically applied by the apparatus, the adhesive film can be applied without projecting beyond the peripheral edge of the wafer 1 because the clearance 9, which is 0.5 mm or more wide, is defined between the peripheral edge of the adhesive film and the peripheral edge of the wafer 1, even if an error of ±0.3 mm is caused in positioning the adhesive film with respect to the reverse side of the wafer 1.

The present invention is not limited to the details of the above-described preferred embodiments. The scope of the invention is defined by the appended claims and all changes and modifications as fall within the equivalence of the scope of the claims are therefore to be embraced by the invention.

What is claimed is:

1. A semiconductor wafer assembly comprising:
    a disk-shaped semiconductor wafer including on a face side a flat area on which a plurality of semiconductor devices are formed and a beveled surface disposed around said flat area, a reverse side of said semiconductor wafer being ground to a thickness which is at least one-half of its original thickness; and
    a circular adhesive film bonded to the reverse side of said semiconductor wafer;
    wherein said adhesive film is bonded only to an area of said reverse side which is coextensive with said flat area;
    wherein said adhesive film is at least 1 mm smaller in diameter than said semiconductor wafer, with a clearance, which is at least 0.5 mm wide, being defined between a peripheral edge of said adhesive film and a peripheral edge of said wafer.

2. A method of processing a disk-shaped semiconductor wafer including on a face side a flat area on which a plurality of semiconductor devices are formed and a beveled surface disposed around said flat area, comprising the steps of:
    bonding a protective tape to the face side of said semiconductor wafer on which the semiconductor devices are formed;
    grinding a reverse side of said semiconductor wafer to a thickness which is at least one-half of its original thickness;
    bonding an adhesive film to the reverse side of said semiconductor wafer only in an area which is coextensive with said flat area on the face side of said semiconductor wafer; and
    holding the reverse side of said semiconductor wafer to which said adhesive film is bonded and peeling off said protective film from said face side of said semiconductor wafer;
    wherein said adhesive film is at least 1 mm smaller in diameter than said semiconductor wafer, with a clearance, which is at least 0.5 mm wide, being defined between a peripheral edge of said adhesive film and a peripheral edge of said wafer.

* * * * *